United States Patent
Kim et al.

(10) Patent No.: US 7,366,271 B2
(45) Date of Patent: Apr. 29, 2008

(54) CLOCK AND DATA RECOVERY DEVICE COPING WITH VARIABLE DATA RATES

(75) Inventors: Chan-Yul Kim, Puchon-shi (KR); Jun-Ho Koh, Suwon-shi (KR); Yun-Je Oh, Yongin-shi (KR)

(73) Assignee: Samsung Electronics Co., Ltd., Maetan-Dong, Yeongtong-Gu, Suwon-Si, Gyeonggi-Do (KR)

( * ) Notice: Subject to any disclaimer, the term of this patent is extended or adjusted under 35 U.S.C. 154(b) by 723 days.

(21) Appl. No.: 10/789,217

(22) Filed: Feb. 27, 2004

(65) Prior Publication Data

US 2004/0258188 A1    Dec. 23, 2004

(30) Foreign Application Priority Data

Jun. 18, 2003   (KR) ...................... 10-2003-0039422

(51) Int. Cl.
*H03D 3/24* (2006.01)
(52) U.S. Cl. ..................................... 375/376
(58) Field of Classification Search ................ 375/350, 375/355, 376
See application file for complete search history.

(56) References Cited

U.S. PATENT DOCUMENTS

| | | | | |
|---|---|---|---|---|
| 4,015,083 | A | * | 3/1977 | Bellisio ...................... 375/376 |
| 4,590,602 | A | * | 5/1986 | Wolaver ...................... 375/375 |
| 5,524,103 | A | * | 6/1996 | Shimizu et al. .......... 369/59.19 |
| 5,572,558 | A | * | 11/1996 | Beherns ...................... 375/376 |
| 5,699,005 | A | * | 12/1997 | Menkhoff et al. .......... 327/292 |
| 6,661,975 | B1 | * | 12/2003 | Hall et al. ................... 398/180 |
| 6,909,331 | B2 | * | 6/2005 | Ballantyne ................... 331/10 |
| 2002/0039211 | A1 | * | 4/2002 | Shen et al. ................. 359/110 |
| 2003/0128786 | A1 | * | 7/2003 | Schmatz et al. ............ 375/359 |

* cited by examiner

*Primary Examiner*—David C. Payne
*Assistant Examiner*—Leon-Viet Q Nguyen
(74) *Attorney, Agent, or Firm*—Cha & Reiter, LLC

(57) ABSTRACT

A clock and data recovery (CDR) device is disclosed that is capable of recovering a clock signal from a data signal that has a variable data rate. The CDR device includes a reference clock generating section for dividing a basic clock by a first predetermined value P, synchronizing the clock and multiplying the clock by a second predetermined value Q to generate a reference clock corresponding to the variable data rate; a clock and data recovery section for receiving the transmitted data, recovering a clock and data from the received data and outputting the recovered clock and data; and a control section for generating a control signal according to the variable data rate and sending the signal to the reference clock generating section and the clock and data recovery section.

7 Claims, 2 Drawing Sheets

CLOCK AND DATA RECOVERY DEVICE COPING WITH VARIABLE DATA RATES

CLAIM OF PRIORITY

This application claims priority to an application entitled "Clock and Data Recovery Device Capable of Coping with Variable Data Rates," filed in the Korean Intellectual Property Office on Jun. 18, 2003 and assigned Serial No. 2003-39422, the contents of which are hereby incorporated by reference.

BACKGROUND OF THE INVENTION

1. Field of the Invention

The present invention relates to a method for processing a digital video image, and more particularly to a method for synchronizing a digital video image when transmitted or received.

2. Description of the Related Art

Conventional digital data systems transmit and receive data in the form of a binary digital signal which includes an unmodulated clock signal. Since there may be a timing skew between an external clock signal and an internal clock signal, such digital data systems must be able to overcome this timing skew problem to accurately recover digital data from a received signal.

To overcome the time skew problem, typically, a clock recovery circuit is used. Particularly, a phase-locked loop (PLL) may be used for clock recovery.

The PLL refers to a phase lock device (circuit) which synchronizes the phase of the received signal. Phase synchronization means controlling an oscillator or a frequency signal generator to maintain a constant phase angle relative to a reference signal. The PLL is widely used in synchronous modulation of a digital modulated wave, coherent carrier tracking, threshold extension, bit synchronization, symbol synchronization and so on. The phase synchronization is accomplished by means of an elastic store (ES) which can independently perform input and output. The elastic store absorbs any phase variation of an input signal which is caused by jitter or delay variation on the transmission path, thereby adjusting the frame phase of the input signal at a particular point of time.

FIG. 1 shows the configuration of a general PLL. As shown in FIG. 1, a general PLL includes a phase/frequency detector 11, a loop filter 12 and a voltage-controlled oscillator 13.

A process for extracting an embedded clock from a received signal using a general PLL will be explained with reference to FIG. 1. When input data is received from an external source, the phase/frequency detector 11 extracts a clock component from the input data and compares the phase of the clock component with that of the voltage-controlled oscillator 13. Any phase difference is detected and is input as an error signal to the loop filter 12. The loop filter 12 filters the error signal input from the phase/frequency detector 11 and compensates for a feedback loop of the PLL to control the voltage-controlled oscillator 13 to extract a clock with a precisely synchronized phase.

The general PLL is configured to recover a clock or data from a data stream with a fixed data bit rate. However, many networks encompass a myriad of data rates so that the general PLL in such networks is problematic. For example, digital video data is transferred at a data rate of 270 Mbps in DVB-ASI (Digital Video Broadcasting-Asynchronous Serial Interface) and at varying data rates of 10 to 80 Mbps in HDTV (High Definition TeleVision). In order to recover data transmitted at such varying data rates, it is critical to recover a clock at each data rate. Therefore, in order to use a conventional PLL in a network encompassing a wide range of data rates, a plurality of PLL circuits that are respectively tuned to different data rates must be provided.

As will be appreciated by one of ordinary skill in the art, a clock recovery circuit using a conventional PLL is complicated, because it has to use different voltage-controlled oscillators (analog devices) depending on data rates. Since the set point is also analog-controlled, the clock recovery circuit is very sensitive and requires more efforts to achieve precise phase synchronization. Also, it is very difficult to implement the clock recovery circuit without using a clock extractor of ordinary data rates.

Therefore, in digital broadcasting or communication environments where clock data must be extracted at different data rates, it is required to change the hardware itself or provide an additional hardware whenever the data rate changes.

Accordingly, there is a need in the art for improved clock recovery mechanisms.

SUMMARY OF THE INVENTION

Accordingly, one object of the present invention is to solve the above-mentioned problems occurring in the prior art.

Another object of the present invention is to provide a clock and data recovery (CDR) device capable of recovering a clock at a variable data rate.

In one embodiment of the present invention, a CDR device is provided that extracts a desired reference frequency based on a single reference clock using a first PLL, inputs the extracted frequency to a second PLL having a PID filter and extracts a clock and data from the inputted data. Using a single reference clock, a clock and data signal from digital broadcasting signals can be extracted having different bit rates (data rates) ranging from 10 Mbps to 30 Mbps, without making any hardware change.

In another embodiment of the present invention, a clock and data recovery (CDR) device is provided that is capable of recovering a clock from data transmitted at a variable data rate. The CDR device includes a reference clock generating section for dividing a basic clock by a first predetermined value P, synchronizing the clock and multiplying the clock by a second predetermined value Q to generate a reference clock corresponding to the variable data rate, a clock and data recovery section for receiving the transmitted data, recovering a clock and data from the received data and outputting the recovered clock and data, and a control section for generating a control signal according to the variable data rate and sending the signal to the reference clock generating section and the clock and data recovery section.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, a preferred embodiment of the present invention will be described with reference to the accompanying drawings. For the purposes of clarity and simplicity, a detailed description of known functions and configurations incorporated herein will be omitted as it may obscure the subject matter of the present invention.

Figure 1:
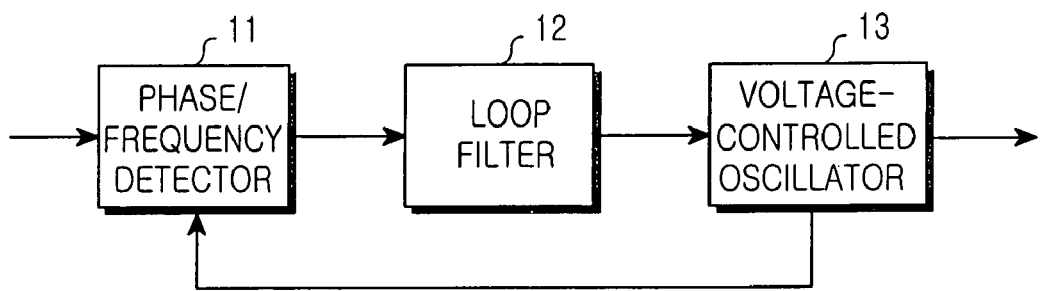
FIG. 1 shows the configuration of a general phase-locked loop (PLL).
Figure 2:
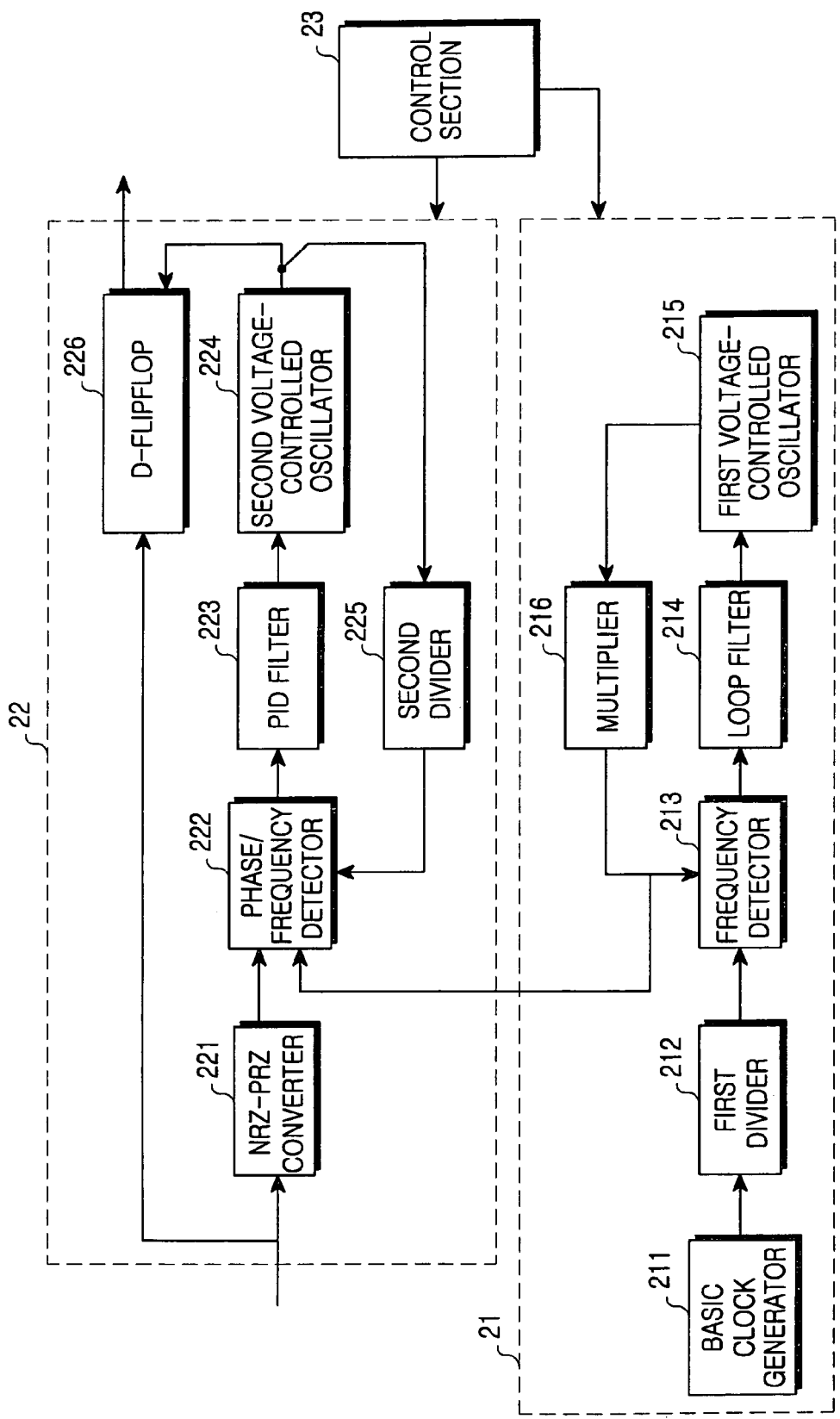
FIG. 2 shows the configuration of a clock and data recovery device capable of coping with variable data rates according to the present invention.

FIG. 2 shows the configuration of a clock and data recovery (CDR) device capable of coping with variable data rates according to one embodiment of the present invention.

As shown in FIG. 2, the clock and data recovery (CDR) device includes a reference clock generating section 21 for generating a reference clock, a clock and data recovery section 22 for recovering a clock and data using the reference clock, and a control section 23 for setting internal parameters of the reference clock generating section 21 and the clock and data recovery section 22 according to the bit rate of data input to the CDR device.

More specifically, the reference clock generating section 21 includes a basic clock generator 211 for generating an internal basic clock of the reference clock generating section 21; a first divider 212 for dividing the basic clock generated by the basic clock generator 211 by a first value P set by the control section 23; a frequency detector 213 for comparing the divided basic clock with an output signal of a multiplier 216 to output an error there between; a loop filter 214 for filtering an error signal output from the frequency detector 213 and compensating for a first feedback loop of the PLL (elements 213, 214 and 215); a first voltage-controlled oscillator 215 for extracting a phase-synchronized clock under the control of the loop filter 214; and the multiplier 216 for multiplying the synchronized clock output from the first voltage-controlled oscillator 215 by a second value Q set by the control section 23 to output a reference clock.

The clock and data recovery section 22 includes a NRZ (No Return to Zero)-PRZ(Pseudo Return to Zero) converter 221 for converting an NRZ signal having no clock component into a PRZ signal including a clock component and outputting the converted signal; a phase/frequency detector 222 for comparing a reference clock output from the reference clock generating section 21 with a clock component of the signal output from the NRZ-PRZ converter 221 to detect a phase error there between, comparing a clock of a signal output from a second divider 225, which has been produced by dividing an output clock of a second voltage-controlled oscillator 224 by a third value M set by the control section 23, with the clock component of the signal output from the NRZ-PRZ converter 221 to detect a frequency error there between, and outputting the frequency error; a PID (Proportional Integral Differential) filter 223 for filtering an error signal received from the phase/frequency detector 222 and compensating for a second feedback loop of the PLL (elements 222, 223 and 224); a second voltage-controlled oscillator 224 for outputting a phase-synchronized clock according to the control of the PID filter 223; a second divider 225 for dividing the synchronized clock outputted from the second voltage-controlled oscillator 224 by a third value M set by the control section 23 to recover a clock and outputting the recovered clock; and a D-flip-flop 226 for receiving an input NRZ signal and the synchronized clock output from the second voltage-controlled oscillator 224 and outputting them in a clock and data combined form.

The control section 23 outputs a control signal for setting the first to third values P, Q and M, respectively, which are internal parameters of the clock and data recovery (CDR) device, according to the transmission rate of data input to the NRZ-PRZ converter 221 of the CDR device.

In the reference clock generating section 21, the basic clock generated by the basic clock generator 211 is converted to (1/P)×(basic clock) by the first divider 212 and input to the frequency detector 213. "P" is a value previously set and input by the control section 23.

The frequency detector 213 compares the (1/P)×(basic clock) signal with a signal produced by multiplying an output of the first voltage-controlled oscillator 215 of the free-running PLL by Q through the multiplier 216 and detects a difference between the two signals. Any difference is then input as an error signal to the loop filter 214. The loop filter 214 filters the error signal and directs it as a control signal to the first voltage-controlled oscillator 215 to obtain a corresponding output. "Q" is a value previously set and input by the control section 23.

The reference clock output by the reference clock generating section 21 is calculated as follows:

$$f_{ref} = (\text{basic clock}) \times (Q/P) \qquad \text{[Equation 1]}$$

It is possible to provide a reference clock having a frequency, which is not a value multiplied by an integer, by setting P and Q to have different register bits (for example, P to 8 and Q to 11) through the control section 23. While conventional PLLs perform a clock recovery operation based on a single fixed reference clock, this embodiment of the present invention can provide various reference clocks according to the data rates required.

The clock and data recovery section 22 receives an NRZ signal having no clock component. The control section 23 monitors the input NRZ data signal and sets the parameters P, Q and M according to the bit rate of the input NRZ data. Since the input NRZ signal has no clock component, it is converted to a signal including a clock component by the NRZ-PRZ converter 221 and input to the phase/frequency detector 222.

The phase/frequency detector 222 compares the phase of the PRZ signal including a clock component with that of the reference clock output from the reference clock recovery section 21 and detects a frequency difference between the PRZ signal and a signal produced by dividing the output of the second voltage-controlled oscillator 224 of the free-running PLL by 1/M through the second divider 225. The PID filter 223 filters an error signal of the frequency and phase differences and directs it as a control signal to the second voltage-controlled oscillator 224 to obtain a corresponding output. "M" is a value previously set and input by the control section 23.

The present invention uses a PID filter for clock and data recovery. While a conventional loop filter takes some time to stabilize the loop and is likely to resonate when incorrectly tuned, the PID filter is a control 'filter' that gets to a goal set point as fast as possible without overshoot or oscillation so that this embodiment of the present invention can recover a stable clock within a shorter period of time, i.e., less than few mili seconds.

Most digital broadcasting systems use a PLL to synchronize clock using an internal PCR (Program Clock Reference). In order to extract a more accurate clock, the PCR code should be longer, i.e., 43 bytes. When a PID controller is used, however, it is possible to recover a stabilized and accurate clock using a shorter PCR code within a shorter period of time, i.e., 80 bits.

PID is commonly used control algorithm in various applications. A PID filter is a control circuit based on the three types of control, i.e., proportional, integral and differential, and achieves the stabilization of control by adding P, I and D terms together. The proportional control drives a control output proportionally to an error, speeding up the system response as the error increases. However, the proportional control results in the generation of an overshoot and a steady state error (offset). This offset can be eliminated by a manual reset input. The integral control adds up the hysteresis error and reflects the error in the control output. An integral controller is not used alone but integrated with a proportional controller to form a PI controller. The integral control can eliminate the stable state error generated during the proportional control. However, the integral control may impair the transient response. The differential control reduces the overshoot and improves the system stability. A PID controller acts as a band pass filter or a band attenuation filter.

Referring again to FIG. 2, the clock recovered by the second voltage-controlled oscillator 224 is input to the D-flip-flop 226 together with the NRZ data to recover data.

As described above, a clock and data recovery (CDR) device is provided that can cope with variable data rates, which can recover a clock and data without any error during transmission and receiving of variable data, such as digital video data.

By using a PID filter for clock and data recovery, the CDR device can recover a clock using a shorter PCR within a shorter period of time, as compared to the prior art.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A clock and data recovery (CDR) device capable of recovering a clock from data transmitted at a variable data rate, the CDR device comprising:

a reference clock generating section arranged to generate a reference clock corresponding to the variable data rate in accordance with a control signal;

a clock and data recovery section arranged to receive the transmitted data, recover a clock and data from the received data and output the recovered clock and data; and a control section arranged to generate the control signal according to the variable data rate and send the control signal to the reference clock generating section, wherein said clock and data recovery section comprises:

a NRZ (No Return to Zero)-PRZ(Pseudo Return to Zero) converter arranged to convert an NRZ signal having no clock component into a PRZ signal including a clock component and outputting the PRZ signal;

a phase/frequency detector arranged to compare the reference clock output from the reference clock generating section with a clock component of the signal outputted from the NRZ-PRZ converter to detect a phase error there between, compare a clock of a signal outputted from a second divider, which has been produced by dividing an output clock of a second voltage-controlled oscillator by a third value M set by the control section, with the clock component of the signal outputted from the NRZ-PRZ converter to detect a frequency error there between, and output the frequency error;

a filter arranged to filter the frequency error and compensate for a feedback loop;

a second voltage-controlled oscillator arranged to output a phase-synchronized clock according to the control of the filter;

a second divider arranged to divide the synchronized clock outputted from the second voltage-controlled oscillator by a third value M which is set by the control section and output the divided clock; and an output section arranged to receive NRZ data and the synchronized clock output from the second voltage-controlled oscillator and output a combined a clock and data signal.

2. A clock and data recovery (CDR) device capable of recovering a clock from data transmitted at a variable data rate, the CDR device comprising:

a reference clock generating section arranged to generate a reference clock corresponding to the variable data rate in accordance with a control signal;

a clock and data recovery section arranged to receive the transmitted data, recover a clock and data from the received data and output the recovered clock and data; and a control section arranged to generate the control signal according to the variable data rate and send the control signal to the reference clock generating section;

wherein said reference clock generating section comprises:

a basic clock generator arranged to generate a basic clock as an internal clock;

a first divider arranged to divide the basic clock generated by the basic clock generator by a first value P set by the control section;

a frequency detector arranged to compare the divided basic clock with an output signal of a multiplier and output an error there between;

a loop filter arranged to filter an error signal output from the frequency detector and compensate for a feedback loop;

a first voltage-controlled oscillator arranged to extract a phase-synchronized clock under the control of the loop filter; and a multiplier arranged to multiply the synchronized clock output from the first voltage-controlled oscillator by a second value Q set by the control section to output the reference clock;

wherein said clock and data recovery section comprises:

a NRZ (No Return to Zero)-PRZ(Pseudo Return to Zero) converter arranged to convert an NRZ signal having no clock component into a PRZ signal including a clock component and outputting the PRZ signal;

a phase/frequency detector arranged to compare the reference clock output from the reference clock generating section with a clock component of the signal outputted from the NRZ-PRZ converter to detect a phase error there between, compare a clock of a signal outputted from a second divider, which has been produced by dividing an output clock of a second voltage-controlled oscillator by a third value M set by the control section, with the clock component of the signal outputted from the NRZ-PRZ converter to detect a frequency error there between, and output the frequency error;

a filter arranged to filter the frequency error and compensate for a feedback loop;

a second voltage-controlled oscillator arranged to output a phase-synchronized clock according to the control of the filter;

a second divider arranged to divide the synchronized clock outputted from the second voltage-controlled oscillator by a third value M which is set by the control section and output the divided clock; and an output section arranged to receive NRZ data and the synchronized clock output from the second voltage-controlled oscillator and output a combined a clock and data signal.

3. The CDR device according to claim 1, wherein said filter is a PID (Proportional Integral Differential) filter.

4. The CDR device according to claim 1, wherein said output section is a D-flip-flop.

5. The CDR device according to claim 2, wherein said filter is a PID (Proportional Integral Differential) filter.

6. The CDR device according to claim 2, wherein said output section is a D-flip-flop.

7. A method for recovering a clock from data transmitted at a variable data rate, the method comprising the steps of:

generating a control signal based upon the data rate signal of a received data signal;

generating a reference clock in accordance with the control signal;

recovering a clock and data from the received data signal; and outputting the recovered clock and data;

wherein said recovering step includes:

converting an NRZ signal having no clock component into a PRZ signal including a clock component and outputting the PRZ signal;

comparing the reference clock with the clock component to detect a phase error there between, comparing a clock of a signal outputted from a divider, which has been produced by dividing an output clock of a voltage-controlled oscillator by a third value M set which is part of the control signal, with the clock component to detect a frequency error there between, and outputting the frequency error;

filtering the frequency error and compensating for a feedback loop;

outputting a phase-synchronized clock, by the voltage-controlled oscillator, according to the control of the filter;

dividing, by the divider, the synchronized clock outputted from the voltage-controlled oscillator by a third value M which is part of the control signal and outputting the divided clock;

receiving NRZ data and the synchronized clock outputted from the voltage-controlled oscillator; and outputting the NRZ data and the synchronized clock as a combined clock and data signal.

* * * * *